(12) United States Patent
Kato et al.

(10) Patent No.: US 9,478,619 B2
(45) Date of Patent: Oct. 25, 2016

(54) DIAMOND SEMICONDUCTOR DEVICE AND METHOD FOR MANUFACTURING SAME

(71) Applicant: NATIONAL INSTITUTE OF ADVANCED INDUSTRIAL SCIENCE AND TECHNOLOGY, Tokyo (JP)

(72) Inventors: Hiromitsu Kato, Ibaraki (JP); Toshiharu Makino, Ibaraki (JP); Masahiko Ogura, Ibaraki (JP); Daisuke Takeuchi, Ibaraki (JP); Satoshi Yamasaki, Ibaraki (JP); Mutsuko Hatano, Tokyo (JP); Takayuki Iwasaki, Tokyo (JP)

(73) Assignee: NATIONAL INSTITUTE OF ADVANCED INDUSTRIAL SCIENCE AND TECHNOLOGY, Tokyo (JP)

( * ) Notice: Subject to any disclaimer, the term of this patent is extended or adjusted under 35 U.S.C. 154(b) by 0 days.

(21) Appl. No.: 14/422,134

(22) PCT Filed: Aug. 8, 2013

(86) PCT No.: PCT/JP2013/071471
§ 371 (c)(1),
(2) Date: Mar. 10, 2015

(87) PCT Pub. No.: WO2014/027600
PCT Pub. Date: Feb. 20, 2014

(65) Prior Publication Data
US 2015/0228727 A1     Aug. 13, 2015

(30) Foreign Application Priority Data
Aug. 17, 2012   (JP) ................................ 2012-180956

(51) Int. Cl.
*H01L 29/16*     (2006.01)
*H01L 29/808*    (2006.01)
(Continued)

(52) U.S. Cl.
CPC ....... *H01L 29/1602* (2013.01); *H01L 21/0242* (2013.01); *H01L 21/0262* (2013.01);
(Continued)

(58) Field of Classification Search
CPC ........... H01L 29/1602; H01L 21/0242; H01L 21/02527; H01L 21/02579; H01L 27/098; H01L 29/045; H01L 29/167; H01L 29/66045; H01L 29/7802; H01L 29/808; H01L 29/8083; H01L 29/0657
See application file for complete search history.

(56) References Cited

U.S. PATENT DOCUMENTS

2005/0202665 A1   9/2005  Namba et al.
2006/0060864 A1*  3/2006  Gerbi ................. H01L 21/0237
                                                             257/77

(Continued)

FOREIGN PATENT DOCUMENTS

JP   2005-075681 A   3/2005
JP   2006-240983 A   9/2006

(Continued)

OTHER PUBLICATIONS

International Search Report dated Oct. 22, 2013, for corresponding International Patent Application No. PCT/JP2013/071471. (with English Translation).

(Continued)

*Primary Examiner* — Fernando L Toledo
*Assistant Examiner* — Neil Prasad
(74) *Attorney, Agent, or Firm* — Pergament & Cepeda LLP; Milagros A. Cepeda; Edward D. Pergament

(57) ABSTRACT

The present invention provides a diamond semiconductor device which includes: a diamond substrate; a diamond step section disposed over substrate surface of the diamond substrate having a {001} crystal face to rise substantially perpendicularly to substrate surface; an n-type phosphorus-doped diamond region; and a diamond insulation region. In the diamond step section, a first step section having a {110} crystal face over a side surface is integrated with a second step section having a {100} crystal face over a side surface. The phosphorus-doped diamond region is formed by crystal growth started from base angle of the step shape of the first step section over the side surface of the first step section and substrate surface of the diamond substrate as growth base planes. The diamond insulation region is formed by crystal growth over the side surface of the second step section and substrate surface of the diamond substrate as growth base planes.

15 Claims, 9 Drawing Sheets

(51) Int. Cl.

| | | |
|---|---|---|
| H01L 29/04 | (2006.01) | |
| H01L 29/66 | (2006.01) | |
| H01L 29/78 | (2006.01) | |
| H01L 21/02 | (2006.01) | |
| H01L 29/167 | (2006.01) | |
| H01L 29/06 | (2006.01) | |

(52) U.S. Cl.
CPC ... *H01L21/02376* (2013.01); *H01L 21/02444* (2013.01); *H01L 21/02527* (2013.01); *H01L 21/02576* (2013.01); *H01L 21/02579* (2013.01); *H01L 21/02609* (2013.01); *H01L 21/02639* (2013.01); *H01L 21/02647* (2013.01); *H01L 29/045* (2013.01); *H01L 29/167* (2013.01); *H01L 29/66045* (2013.01); *H01L 29/7802* (2013.01); *H01L 29/808* (2013.01); *H01L 29/8083* (2013.01); *H01L 29/0657* (2013.01)

(56) References Cited

U.S. PATENT DOCUMENTS

| | | | |
|---|---|---|---|
| 2006/0157713 A1* | 7/2006 | Linares | B82Y 10/00 257/77 |
| 2008/0193366 A1 | 8/2008 | Kato et al. | |
| 2011/0037076 A1 | 2/2011 | Kato et al. | |
| 2012/0025316 A1 | 2/2012 | Schultz | |

FOREIGN PATENT DOCUMENTS

| | | |
|---|---|---|
| WO | 03/106743 A1 | 12/2003 |
| WO | 2009/128301 A1 | 10/2009 |
| WO | 2010/001705 A1 | 1/2010 |
| WO | 2012/018789 A1 | 2/2012 |

OTHER PUBLICATIONS

Written Opinion dated Oct. 22, 2013, for corresponding International Patent Application No. PCT/JP2013/071471. (with English Translation).

Supplementary European Search Report dated Mar. 14, 2016, issued by the European Patent Office, for corresponding Patent Application No. EP 13 87 9581.

Hoshino et al., "Electrical properties of lateral p-n junction diodes fabricated by selective growth of n+ diamond", Phys. Status Solidi A, 2012, pp. 1761 to 1764, vol. 209—issue No. 9, Wiley-VCH Verlag GmbH & Co., KGaA, Weinheim.

Kato et al., "Maskless selective growth for p-n Junction Applications on (001)-Oriented Diamond", Japanese Journal of Applied Physics, 2012, pp. 090118-1 to 090118-7, vol. 51, The Japan Society of Appied Physics.

Kato et al., "Selective growth of buried n+ Diamond on (001) Phosphorus-Doped n-type Diamond Film", Applied Dhysics Express, 2009, pp. 055502-1 to 055502-3, vol. 2, The Japan Society of Applied Physics.

\* cited by examiner

DIAMOND SEMICONDUCTOR DEVICE AND METHOD FOR MANUFACTURING SAME

This application is a National Phase application under 35 U.S.C. 371 of International Application No. PCT/JP2013/071471, filed on Aug. 8, 2013, which claims priority to Japanese provisional application No. 2012-180956, filed on Aug. 17, 2012; all of which are hereby incorporated by reference in their entireties.

TECHNICAL FIELD

The present invention relates to a diamond semiconductor device utilizing selective growth of a diamond crystal, and a method for manufacturing the same.

BACKGROUND ART

For efficient electricity utilization, multistage power conversions (AC-DC conversion, and frequency conversion) are performed in the process from power generation to power consumption, and many semiconductor power devices are used. Reduction of power loss in these semiconductor power devices is an important key to energy saving.

Diamond has a band gap broader than that of silicon used commonly as a semiconductor material, has high properties in terms of melting point, thermal conductivity, dielectric breakdown durability, carrier speed limit, hardness/elastic constant, chemical stability, and radiation-proofness, and has a very high potential as a material of electric devices, particularly, semiconductor power devices.

However, there have been problems with diamond. It is difficult to dope diamond with an impurity by ion implantation and the like that are employed for other semiconductor materials, which is an obstacle against selective formation of an n-type impurity-doped region, and against device design to the purpose.

With regard to these problems, the present inventors have succeeded in selective formation of n-type impurity-doped diamond, by promoting crystal growth of an n-type impurity-doped diamond region from a starting point that is set at a base angle of a step-like shape formed over a diamond substrate having a controlled crystal face, and have made proposals for realization of diamond semiconductor devices (see International Publication No. WO 2010/001705).

However, what has remained unachieved is a specific method for constructing an electronic device composed of various elements including a semiconductor power device, and there have been demands for development of a diamond semiconductor device allowing a greater degree of latitude in device design, and a method for manufacturing such a diamond semiconductor device. Particularly, if it is possible to realize selective integral formation of a diamond region doped with an impurity at an intended location and an undoped diamond insulation region, and to thereby construct an element structure that enables element isolation by means of these regions, it is possible to realize a diamond semiconductor device having a FET (field effect transistor) structure in which, for example, a region around a doped region is isolated by an insulation region, and only the element region around the doped region is defined as a channel length. Therefore, such selective integral formation will make it possible to greatly increase the degree of latitude in device design, and to efficiently manufacture a diamond semiconductor device.

SUMMARY OF INVENTION

Technical Problem

The present invention aims to solve the various conventional problems described above and achieve the object described below. That is, an object of the present invention is to provide a diamond semiconductor device that can greatly increase the degree of latitude in device design and can be manufactured efficiently, and a method for manufacturing such a diamond semiconductor device.

Solution to Problem

Means for solving the above problems are as follows.

In one aspect, the present invention provides a diamond semiconductor device, including:
a diamond substrate;
a diamond step section disposed over a substrate surface of the diamond substrate having a {001} crystal face in a manner to rise from the substrate surface substantially perpendicularly to the substrate surface, the diamond step section forming a step shape with risen top and side surfaces thereof, and with the substrate surface;
an n-type phosphorus-doped diamond region; and
a diamond insulation region,
wherein in the diamond step section, a first step section having a {110} crystal face over a side surface thereof, and a second step section having a {100} crystal face over a side surface thereof are integrated with each other,
wherein the phosphorus-doped diamond region is formed by crystal growth started from a base angle of the step shape of the first step section over the side surface of the first step section and the substrate surface of the diamond substrate as growth base planes, and
wherein the diamond insulation region is formed by crystal growth over the side surface of the second step section and the substrate surface of the diamond substrate as growth base planes.

In one variant, the present invention provides a diamond semiconductor device according to the present invention, wherein the first step section has an elongate line shape when seen in a plan view, and the second step section is integrated with at least any end position of the first step section assumed as a trunk section.

In one variant, the present invention provides a diamond semiconductor device according to the present invention, wherein the diamond semiconductor device includes the phosphorus-doped diamond region over both side surfaces of the first step section having the line shape.

In one variant, the present invention provides a diamond semiconductor device according to the present invention, wherein the second step section has the {100} crystal face over at least part of side surfaces thereof that are located on left and right sides with respect to a line direction of the first step section when the second step section is seen in a plan view.

In one variant, the present invention provides a diamond semiconductor device according to the present invention, wherein a line width W of the first step section having the line shape is from 100 nm to 10 μm.

In one variant, the present invention provides a diamond semiconductor device according to the present invention, wherein a ratio H/W of a height H to a line width W of the first step section having the line shape is from 0.001 to 100.

In one variant, the present invention provides a diamond semiconductor device according to the present invention, wherein the diamond semiconductor device includes a p-type impurity-doped region in the diamond step section.

In one variant, the present invention provides a diamond semiconductor device according to the present invention, wherein a phosphorus concentration in the phosphorus-doped diamond region is from $1\times10^{16}$ cm$^{-3}$ to $1\times10^{21}$ cm$^3$.

In one variant, the present invention provides a diamond semiconductor device according to the present invention, wherein the diamond semiconductor device includes a plurality of the diamond step section in each of which the first step section has an elongate line shape when seen in a plan view, and the second step section is integrated with at least any end position of the first step section assumed as a trunk section, and wherein the diamond step sections are disposed side by side at left and right positions with respect to a line direction of the first step sections.

In one variant, the present invention provides a diamond semiconductor device according to the present invention, wherein an interval between the first step sections of the diamond step sections disposed side by side is from 0.01 to 2 times as large as a height H of the first step sections.

In one variant, the present invention provides a diamond semiconductor device according to the present invention, wherein the diamond semiconductor device includes: a gate electrode at the phosphorus-doped diamond region formed over each of both side surfaces of the first step section; a source electrode at one of two second step sections that are formed at both end positions respectively of the first step section assumed as a trunk section; and a drain electrode at the other second step section.

In one variant, the present invention provides a diamond semiconductor device manufacturing method for manufacturing the diamond semiconductor device according to the present invention, including:

a diamond step section forming step of applying lithography to a diamond substrate using a mask in a manner to form a first step section and a second step section, to thereby form a diamond step section; and a phosphorus-doped diamond region/diamond insulation region forming step of forming a phosphorus-doped diamond region by crystal growth started from a base angle of a step shape of the first step section over a side surface of the first step section and a substrate surface of the diamond substrate as growth base planes, and at a same time, forming a diamond insulation region by crystal growth over a side surface of the second step section and the substrate surface of the diamond substrate as growth base planes, by CVD using a diamond source and a phosphorus source as material gases.

Advantageous Effects of Invention

The present invention can solve the various conventional problems described above, and can provide a diamond semiconductor device that can greatly increase the degree of latitude in device design and can be manufactured efficiently, and a method for manufacturing such a diamond semiconductor device.

DESCRIPTION OF EMBODIMENTS

Figure 1:
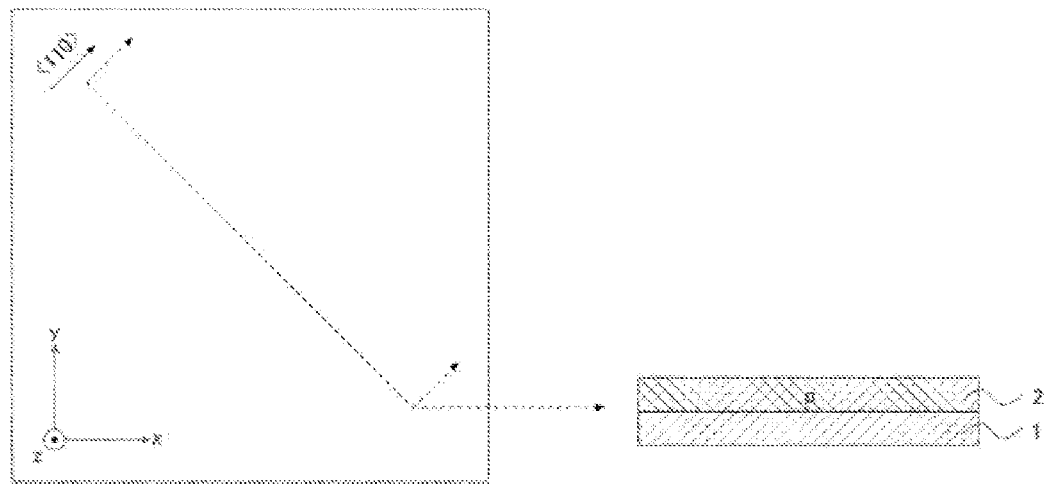
FIG. 1 is a diagram (1) showing a manufacturing process of a diamond semiconductor device according to a first embodiment.

Diamond Semiconductor Device and Method for Manufacturing Same

A diamond semiconductor device of the present invention includes a diamond substrate, a diamond step section, an n-type phosphorus-doped diamond region, and a diamond insulation region, and includes other structural portions according to necessity.

<Diamond Substrate>

The diamond substrate is a diamond single crystal substrate, and has a {001} crystal face over the substrate surface thereof. The substrate is not particularly limited, and may be an arbitrary substrate such as a commercially available product as long as it has the characteristic described above.

<Diamond Step Section>

The diamond step section is disposed over the substrate surface of the diamond substrate having the {001} crystal face in a manner to rise from the substrate surface substantially perpendicularly to the substrate surface, and forms a step shape with risen top and side surfaces thereof and with the substrate surface. The diamond step section has a characteristic that a first step section having a {110} crystal face over a side surface thereof and a second step section having a {100} crystal face over a side surface thereof are integrated with each other as the diamond step section. By including such two step sections having different crystal faces, it can construct an element structure that enables element isolation by means of the phosphorus-doped diamond region and the diamond insulation region that are to be formed over the side surfaces of the two step sections. That is, there will exist the diamond insulation region next to a power conduction region of a semiconductor device to be formed based on the phosphorus-doped diamond region. Therefore, there will be no current to leak to a different element, which enables device design on an individual element basis.

The diamond step section is formed by applying lithography to the diamond substrate using a mask in a manner to form the first step section and the second step section (a diamond step section forming step).

That is, it is possible to form the diamond step section by forming a mask over the diamond substrate in a manner to form the first step section and the second step section, and after this, applying lithography using the mask. In this case, the mask is formed in consideration of the position at which it is formed such that the crystal faces of the side surfaces of the first step section and second step section to be formed by the lithography may be a {110} face and a {100} face, respectively. It is possible to provide a {110} face over the side surface of the first step section and a {100} face over the side surface of the second step section, by forming the side surface of the second step section to extend along a direction inclined by 45° from the direction in which the side surface of the first step section extends in a plan view.

The diamond step section is not particularly limited, and may include a p-type impurity-doped region that is doped with a p-type impurity such that this region will form a p/n junction with the n-type phosphorus-doped diamond region.

In this case, it is possible to form the p-type impurity-doped region in the diamond step section, by applying the lithography to a diamond substrate in which a p-type impurity-doped region has been formed in an external surface thereof by CVD (Chemical Vapor Deposition) using a diamond source and a p-type impurity source as material gases.

The p-type impurity may be boron, and the boron concentration in the p-type impurity region is preferably from $1 \times 10^{15}$ cm$^{-3}$ to $1 \times 10^{18}$ cm$^{-3}$.

The shape of the diamond step section is not particularly limited except that the diamond step section should include the first step section and the second step section. For example, in a preferable shape, the first step section may have an elongate line shape when seen in a plan view, and the second step section may be integrated with at least any end position of the first step section assumed as a trunk section.

A line width W of the first step section having the line shape is preferably from 100 nm to 10 µm. When the line width is less than 100 nm, pattern formation may not be available with lithography. When the line width is greater than 10 µm, it may not be possible to bring the semiconductor device into an off state at effective voltages of 100 volt or lower.

A ratio H/W of a height H to the line width W of the first step section having the line shape is preferably from 0.001 to 100. When H/W is less than 0.001, it may not be possible to form the first step section by controlling the height H thereof. When H/W is greater than 100, it may not be possible to form a step.

As regards the preferable shape, in order to achieve a favorable element isolation, it is more preferable that the second step section have {100} crystal faces over at least part of side surfaces thereof that are located on the left and right sides with respect to the line direction of the first step section when the second step section is seen in a plan view.

As regards the preferable shape, in order for a more practical semiconductor device to be formed, a plurality of the diamond step section may be provided over the diamond substrate. In this case, it is preferable that the diamond step sections be disposed side by side at left and right positions with respect to the line direction of the first step sections.

The interval between the first step sections of the diamond step sections disposed side by side is preferably from 0.01 to about 2 times as large as the height H of the first step sections. When the interval is less than 0.01 times as large, it may not be possible to form a deep groove having step sections in a controlled manner. When the interval is greater than about 2 times as large, it may not be possible to fill the groove with a phosphorus-doped diamond layer.

<Phosphorus-Doped Diamond Region and Diamond Insulation Region>

The phosphorus-doped diamond region is formed by crystal growth started from a base angle of the step shape of the first step section over a side surface of the first step section and the substrate surface of the diamond substrate as growth base planes. The diamond insulation region is formed by crystal growth over a side surface of the second step section and the substrate surface of the diamond substrate as growth base planes.

These diamond crystal grown regions are formed by promoting crystal growth of the phosphorus-doped diamond region from a base angle of the step shape of the first step section over a side surface of the first step section and the substrate surface of the diamond substrate as growth base planes, and at the same time, promoting crystal growth of the diamond insulation region over a side surface of the second step section and the substrate surface of the diamond substrate as growth base planes, by CVD using a diamond source and a phosphorus source as material gases (a phosphorus-doped diamond region/diamond insulation region forming step).

When the first step section of the diamond step section has a line shape, the phosphorus-doped diamond region may be formed over both side surfaces of the first step section in the phosphorus-doped diamond region/diamond insulation region forming step.

When the second step section has {100} crystal faces over side surfaces thereof that are located on the left and right sides with respect to the line direction of the first step section, the diamond insulation region may be formed over these crystal faces in the phosphorus-doped diamond region/diamond insulation region forming step.

The phosphorus concentration in the phosphorus-doped diamond region is not particularly limited, but is preferably from $1 \times 10^{16}$ cm$^{-3}$ to $1 \times 10^{21}$ cm$^{-3}$, and more preferably from $5 \times 10^{16}$ cm$^{-3}$ to $5 \times 10^{20}$ cm$^{-3}$. When the phosphorus concentration is lower than $1 \times 10^{16}$ cm$^{-3}$, the phosphorus-doped diamond region may become an insulation layer similar to the diamond insulation region. When the phosphorus concentration is higher than $1 \times 10^{21}$ cm$^{-3}$, the phosphorus-doped diamond region may have a poor crystallinity, which may degrade the performance of the semiconductor device.

The other structural portions are not particularly limited, and arbitrary structural portions may be selected according to the purpose of designing the semiconductor device to be constructed. Examples thereof include an electrode, and a p⁺ contact region.

The electrode is formed according to the semiconductor device to be constructed. When what is to be manufactured is a junction-type field effect transistor, a gate electrode, a source electrode, and a drain electrode are formed.

That is, in the manufacture of the junction-type field effect transistor, the gate electrode is formed at the phosphorus-doped diamond region formed over each of both of the side surfaces of the first step sections, the source electrode is formed at one of two second step sections formed at both end positions of the first step section assumed as a trunk section, and the drain electrode is formed at the other second step section.

The p⁺ contact region is provided in order to suppress contact resistance with respect to a metal. After the p⁺ contact region is formed at the second step section, an electrode made of any kind of a metal is formed to have contact with the p⁺ contact region. The concentration of boron to be doped in the p⁺ contact region is preferably from $1\times10^{19}$ cm$^{-3}$ to $1\times10^{22}$ cm$^{-3}$.

First Embodiment

An example embodiment of the diamond semiconductor device of the present invention will be described below.

First, a first embodiment of the diamond semiconductor device will be described together with a manufacturing process thereof with reference to FIG. 1 to FIG. 4. The diamond semiconductor device according to the first embodiment constitutes a planar junction-type field effect transistor. In each diagram, the left drawing shows a planar surface, and the right drawing shows a cross-sectional surface.

First, a diamond substrate 1 having a {001} crystal face over a substrate surface thereof is prepared. A p-type diamond layer 2 doped with a p-type impurity is formed over the substrate surface by CVD using a diamond source and a p-type impurity source as material gases (see FIG. 1).

Figure 2:
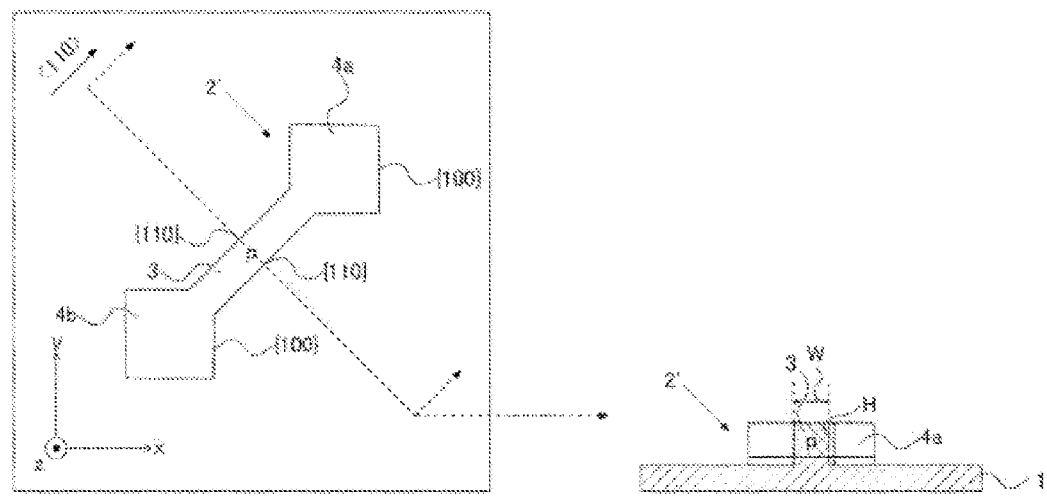
FIG. 2 is a diagram (2) showing a manufacturing process of a diamond semiconductor device according to a first embodiment.

Next, by lithography using a mask, the diamond substrate 1 and the p-type diamond layer 2 are etched to a diamond step section 2' (see FIG. 2). At this time, the diamond step section 2' is formed to have: a first step section 3 having {110} crystal faces over side surfaces thereof and having an elongate line shape; and second step sections 4a and 4b at both end positions of the first step section 3 assumed as a trunk section that each have {100} crystal faces over side surfaces thereof. The {110} faces of the first step section 3 are formed by forming the side surfaces along a crystal orientation of the diamond substrate 1 in the <110> direction. The {100} faces of the second step sections 4a and 4b are formed by forming the side surfaces along a direction that is inclined by 45° from the direction in which the side surfaces of the first step section 3 extend. Each of the second step sections 4a and 4b has four {100} faces over its side surfaces. The line width and height of the first step section 3 having a line shape are denoted by signs W and H in FIG. 2.

Figure 3:
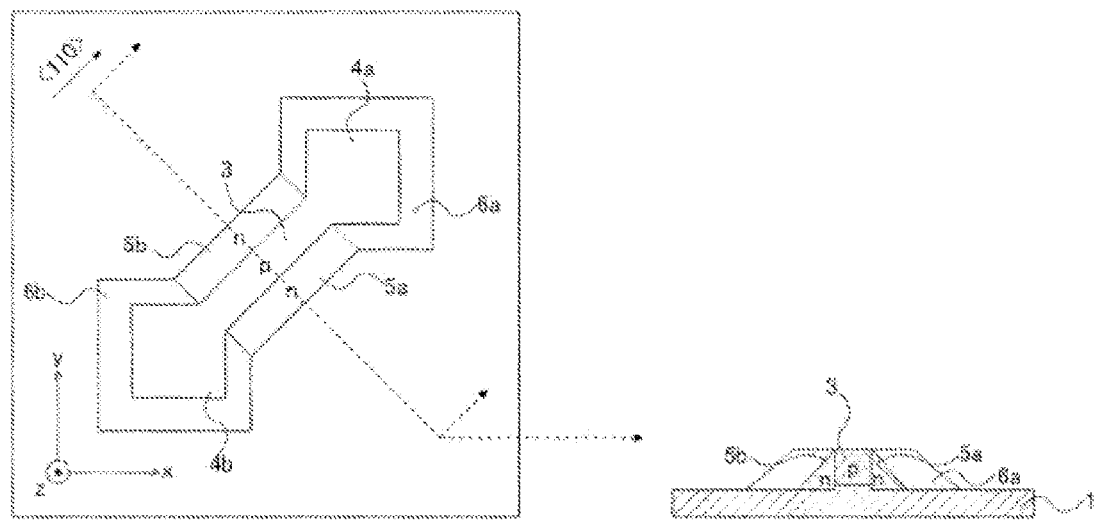
FIG. 3 is a diagram (3) showing a manufacturing process of a diamond semiconductor device according to a first embodiment.

Next, by CVD using a diamond source and a phosphorus source as materials, phosphorus-doped diamond regions 5a and 5b are formed by crystal growth started from base angles of the step shape of the first step section 3 over the side surfaces ({110} faces) of the first step section and the substrate surface of the diamond substrate 1 as growth base planes, and at the same time, diamond insulation regions 6a and 6b are formed over the side surfaces ({100} faces) of the second step sections 4a and 4b and the substrate surface of the diamond substrate 1 as growth base planes (see FIG. 3). This results in that no diamond crystal has grown over the substrate surface of the diamond substrate 1, and that diamond insulation regions 6a and 6b formed over the side surfaces of the second step sections 4a and 4b have been doped with substantially no phosphorus and can be regarded as insulation regions. Hence, based on the shape of the diamond step section 2', the phosphorus-doped diamond regions 5a and 5b can be selectively formed over only the side surfaces of the first step section 3, and the diamond insulation regions 6a and 6b can be selectively formed over only the side surfaces of the second step sections 4a and 4b.

Finally, a source electrode 8 is formed over the second step section 4a, a drain electrode 9 is formed over the second step section 4b, and gate electrodes 7a and 7b are formed over the phosphorus-doped diamond regions 5a and 5b respectively. In this way, the diamond semiconductor device 10 according to the first embodiment is manufactured (see FIG. 4).

A device operation of the diamond semiconductor device 10 constituted as a planer junction-type field effect transistor will be described with reference to FIG. 5A to FIG. 5D. FIG. 5A to FIG. 5D are diagrams showing an expanse of a depletion layer that changes according to gate voltage application conditions. They show a state of a gate voltage being raised in the order of FIG. 5A to FIG. 5D. When application of a gate voltage is started from a state in which no gate voltage is applied (see FIG. 5A), depletion layers D occur in the p-type diamond region (channel region) of the first step section 3 (see FIG. 5B). These depletion layers D expand to a larger size as the gate voltage is raised (see FIG. 5C), and dominantly expand to all over the p-type diamond region eventually (see FIG. 5D). This enables the diamond semiconductor device 10 to function as an element in which a drain current flowing between the source and drain is controlled by the depletion layers D.

In this diamond semiconductor device 10, the presence of the diamond insulation regions 6a and 6b can prevent leakage of the drain current to other elements and realize secure element isolation, and the length of the channel formed between the source and drain can be defined securely based on the positions at which the diamond insulation regions 6a and 6b are disposed.

Second Embodiment

Next, a second embodiment of the diamond semiconductor device will be described together with a manufacturing process thereof with reference to FIG. 6 to FIG. 9. The diamond semiconductor device according to the second embodiment is a version of the diamond semiconductor device according to the first embodiment that additionally includes a p⁺ contact region. In each diagram, the left drawing shows a planar surface, and the right drawing shows a cross-sectional surface.

First, a diamond substrate 11 having a {001} crystal face over a substrate surface thereof is prepared. A p-type diamond layer 12a doped with a p-type impurity and a p⁺ type diamond layer 12b doped with a p-type impurity at a high concentration are formed over the substrate surface by CVD using a diamond source and a p-type impurity source as material gases (see FIG. 6).

Figure 7:
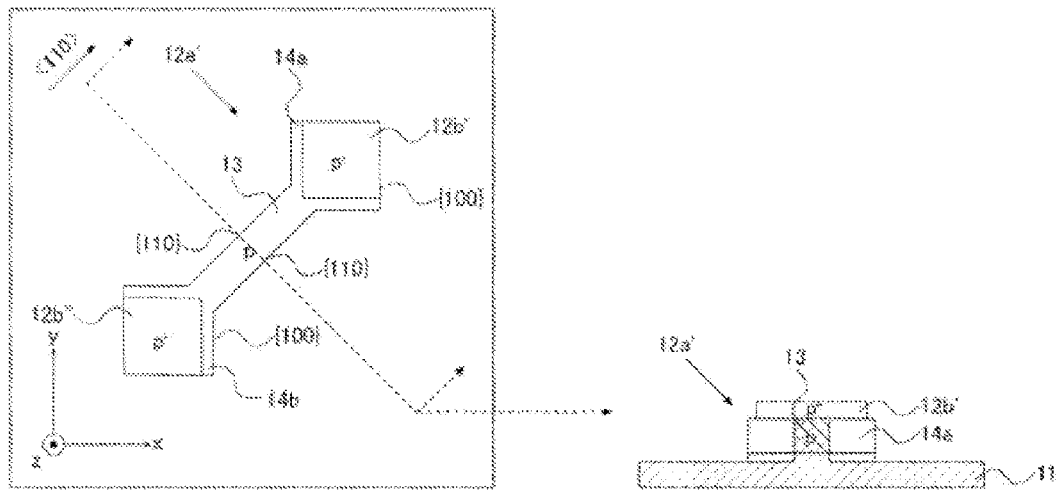
FIG. 7 is a diagram (2) showing a manufacturing process of a diamond semiconductor device according to a second embodiment.

Next, by lithography using a mask, the diamond substrate 11 and the p-type diamond layer 12a are etched to a diamond step section 12a' (see FIG. 7). At this time, the diamond step section 12a' is formed to have: a first step section 13 having {110} crystal faces over side surfaces thereof and having an elongate line shape; and second step sections 14a and 14b at both end positions of the first step section 13 assumed as a trunk section that each have {100} crystal faces over side surfaces thereof. Further, the p$^+$ diamond layer 12b is lithographed to p$^+$ contact regions 12b' and 12b" over the second step sections 14a and 14b.

Figure 8:
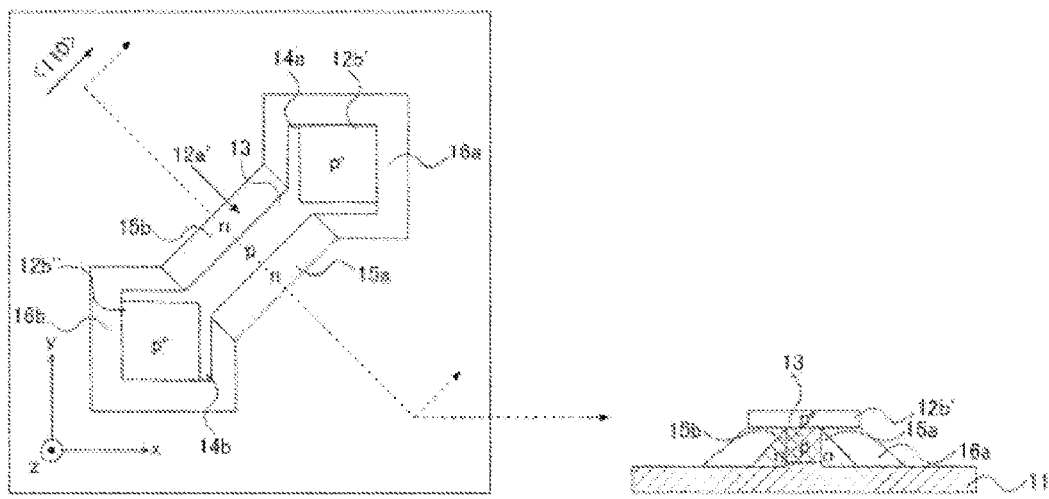
FIG. 8 is a diagram (3) showing a manufacturing process of a diamond semiconductor device according to a second embodiment.
Figure 9:
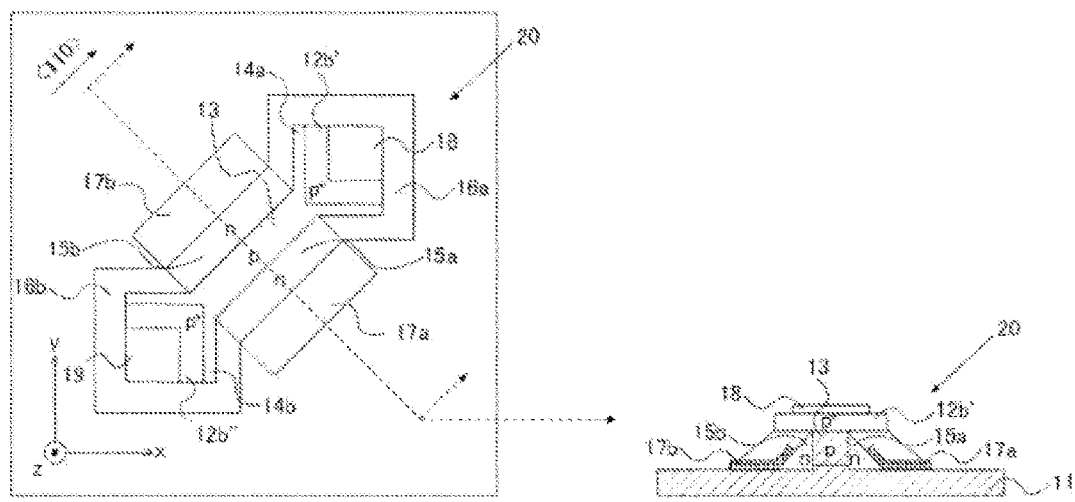
FIG. 9 is a diagram (4) showing a manufacturing process of a diamond semiconductor device according to a second embodiment.

Next, by CVD using a diamond source and a phosphorus source as materials, phosphorus-doped diamond regions 15a and 15b are formed by crystal growth started from base angles of the step shape of the first step section 13 over the side surfaces ({110} faces) of the first step section and the substrate surface of the diamond substrate 11 as growth base planes, and at the same time, diamond insulation regions 16a and 16b are formed over the side surfaces ({100} faces) of the second step sections 14a and 14b and the substrate surface of the diamond substrate 11 as growth base planes (see FIG. 8).

Finally, a source electrode 18 is formed over the p$^+$ contact region 12b', a drain electrode 19 is formed over the p$^+$ contact region 12b", and gate electrodes 17a and 17b are formed over the phosphorus-doped diamond regions 15a and 15b respectively. In this way, the diamond semiconductor device 20 according to the second embodiment is manufactured (see FIG. 9).

Because the diamond semiconductor device 20 according to the second embodiment includes the p$^+$ contact regions 12b' and 12b", it can suppress contact resistance with respect to a metal electrode. Except for this respect, it is identical with the diamond semiconductor device 10 according to the first embodiment, and thus will not be described any further.

Note that the applications of the diamond semiconductor device of the present invention are not limited to these planar field effect semiconductor device examples. Other examples include semiconductor devices having various element structures.

Third Embodiment

The diamond semiconductor device of the present invention may have not only a planar device structure but also a vertical device structure.

Figure 10A:
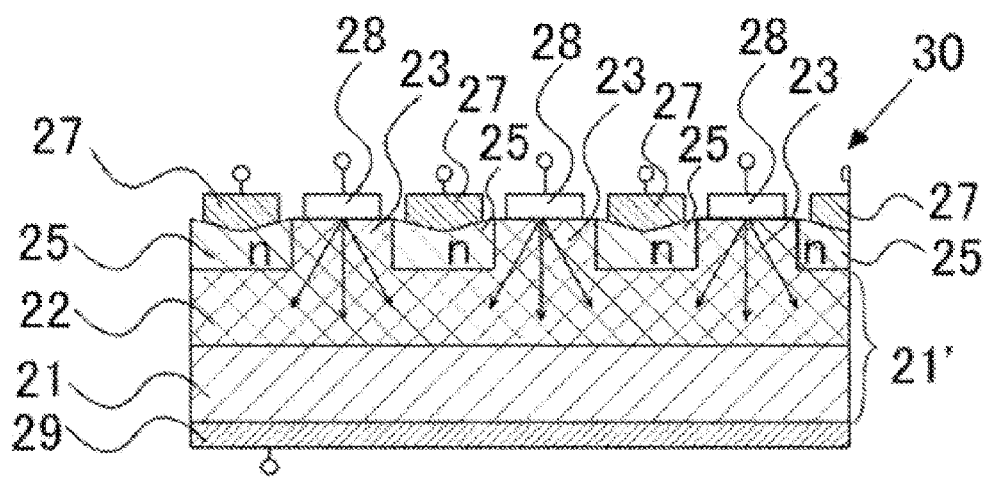
FIG. 10A is an explanatory diagram showing a partial cross-sectional structure of a diamond semiconductor device according to a third embodiment.
Figure 10B:
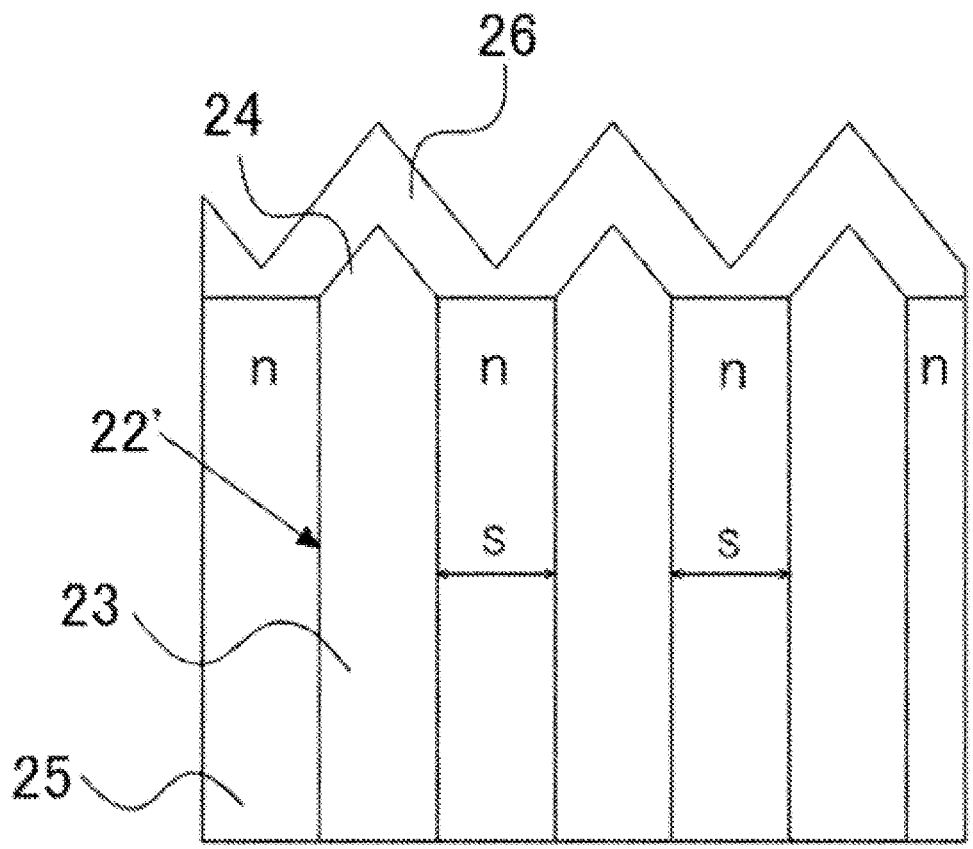
FIG. 10B is a partial plan view of FIG. 10A.

As an example of a semiconductor device having a vertical device structure, a diamond semiconductor device according to a third embodiment constituted as a vertical junction-type field effect transistor will be described with reference to FIG. 10A and FIG. 10B. FIG. 10A is an explanatory diagram showing a partial cross-sectional structure of the diamond semiconductor device according to the third embodiment. FIG. 10B is a partial plan view of FIG. 10A.

As shown in FIG. 10A and FIG. 10B, the diamond semiconductor device 30 according to the third embodiment includes a diamond substrate 21, a p-type semiconductor layer 22, diamond step sections 22' formed of the p-type semiconductor layer 22, phosphorus-doped diamond regions 25 formed over side surfaces of first step sections 23 of the diamond step sections 22', a diamond insulation region 26 formed over a side surface of a second step section 24, gate electrodes 27 formed over the phosphorus-doped diamond regions 25, a source electrode 28 formed over the second step section 24, and a drain electrode 29 formed over a surface of the diamond substrate 21 opposite to the surface thereof over which the p-type semiconductor layer 22 is formed.

Here, there are a plurality of the diamond step sections 22', and these diamond step sections 22' are disposed side by side at left and right positions with respect to the line direction of the first step sections 23. The second step section 24 is formed at one end of the first step sections 23 having a line shape. The interval between the first step sections 23 is denoted by a sign S in FIG. 10B.

The basic structure of the diamond semiconductor device 30 can be manufactured according to substantially the same method as manufacturing the diamond semiconductor device 10 according to the first embodiment, by handling the base formed of: the diamond substrate 21; and the p-type semiconductor layer 22 as a diamond substrate 21'. Further, the electrodes can be formed according to a conventionally publicly-known manufacturing method.

The diamond semiconductor device 30 according to the third embodiment having the structure described above as a vertical junction-type field effect transistor has channels formed as shown by arrows in FIG. 10A, and can operate by the same operation principle as that of the diamond semiconductor device 10 according to the first embodiment.

Fourth Embodiment

Figure 11:
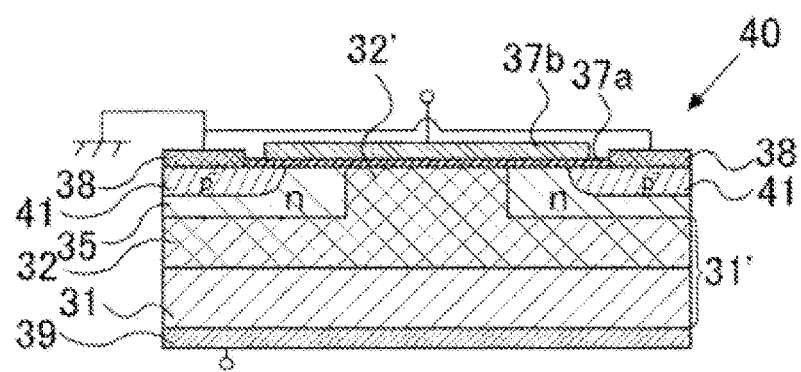
FIG. 11 is an explanatory diagram showing a partial cross-sectional structure of a diamond semiconductor device according to a fourth embodiment.

As another example of a vertical device structure, a diamond semiconductor device according to a fourth embodiment constituted as a vertical MOSFET will be described with reference to FIG. 11. FIG. 11 is an explanatory diagram showing a partial cross-sectional structure of the diamond semiconductor device according to the fourth embodiment.

As shown in FIG. 11, the diamond semiconductor device 40 according to the fourth embodiment includes a diamond substrate 31, a p-type semiconductor layer 32, a diamond step section 32' formed of the p-type semiconductor layer 32, phosphorus-doped diamond regions 35 formed over side surfaces of a first step section of the diamond step section 32', and a diamond insulation region (unillustrated) formed over side surfaces of a second step section. P$^+$ diamond regions 41 are formed near the regions where the phosphorus-doped diamond regions 35 are formed. After once the phosphorus-doped diamond regions 35 are formed in the same manner as in Example 1, the phosphorus-doped diamond regions are partially removed by etching, and CVD is performed over the removed regions, to thereby form the p$^+$ regions 41.

In this state, a gate electrode 37b is formed over a portion of the p$^+$ regions 41, over the phosphorus-doped diamond regions 35, and over the diamond step section 32' via a gate insulation film 37a, and source electrodes 38 are formed over open regions of the p$^+$ regions 41. A drain electrode 39 is formed over a surface of the diamond substrate 31 opposite to the surface thereof over which the p-type semiconductor layer 32 is formed. In this way, the diamond semiconductor device 40 according to the fourth embodiment having a vertical MOSFET structure can be manufactured.

When a negative voltage is applied to the gate electrode 37b of the diamond semiconductor device 40, an inverted channel layer is formed by holes in the n-type phosphorus-doped diamond regions 35 near the interface to the gate insulation film 37a. When a negative voltage is applied to the drain electrode 39 in this state, holes migrate from the source electrodes 38 to the drain electrode 39 to thereby flow a current. The device operates by being controlled in this manner.

EXAMPLES

A diamond semiconductor device according to an Example was manufactured as follows. Here, a planar junction-type field effect transistor shown in FIG. 4 was manufactured.

First, a diamond single crystal substrate 1 having a {001} face over an external surface thereof was prepared. Using a microwave plasma CVD apparatus, boron-doped diamond was synthesized over the substrate 1 under the conditions of $H_2$ at 400 sccm (Standard Cubic Centimeter per Minute), $CH_4$ at 2.4 sccm, a $B_2H_6/H_2$ gas (100 ppm) at 0.24 sccm, at a pressure of 25 Torr (1 Torr=133.322 Pa), at a microwave power of 750 W, at a substrate heater temperature of 800° C., and for a growing time of 3 hours, to thereby form a boron-doped p-type diamond layer 2 having a film thickness of about 700 nm (see FIG. 1).

Next, by electron beam graphy and a lift-off process, a Au/Ti thin film mask (Au: 300 nm/Ti: 10 nm) having the same planar shape as that of the diamond step section 2' shown in FIG. 2 was formed over a portion of an external surface of the {001}-face diamond single crystal substrate 1. The mask was disposed such that the first step section 3 of the diamond step section 2' to be formed later would have {110} faces over side surfaces thereof, and that the second step sections 4a and 4b would have {100} faces over side surfaces thereof In this state, anisotropic etching using the mask was performed with an inductively-coupled plasma etching apparatus. Etching gas conditions were $O_2$ at 95 sccm, $CF_4$ at 2 sccm, at a RF power of 300 W, at a bias of 50 W, at a pressure of 2 Pa, and to an etching depth of 1.4 μm. After this, the substrate was subjected to a hot aqua regia treatment ($HNO_3$:HCl=1:3, 80° C.), a sulfuric acid hydrolysis ($H_2SO_4$: $H_2O_2$:$H_2O$=3:1:1, 120° C.) treatment, and a hot mixed acid ($HNO_3$:$H_2SO_4$=1:3, 240° C.) treatment, to thereby remove the Au/Ti mask. In this way, a diamond step section 2' shown in FIG. 2, in which a first step section 3 having {100} crystal faces over side surfaces thereof was integrated with second step sections 4a and 4b having {100} crystal faces over side surfaces thereof, was formed. Here, the line width of the first step section 3 was 0.5 μm, and the height thereof was 1.4 μm.

Phosphorus-doped diamond regions 5a and 5b and diamond insulation regions 6a and 6b were formed over the substrate 1 on which the diamond step section 2' was formed. The formation was performed with a microwave plasma CVD apparatus under the conditions of $H_2$ at 398 sccm, $CH_4$ at 0.2 sccm, $PH_3$ at 0.1 sccm, at a pressure of 75 Torr, at a microwave power of 750 W, at a substrate heater temperature of 800° C., and for a growing time of 2 hours. As a result, the phosphorus-doped diamond regions 5a and 5b were grown and formed in a <111> direction as started from the base angles of the step shape of the first step section 3 over the side surfaces of the first step section 3 and the substrate surface of the substrate 1 as growth base planes, and the diamond insulation regions 6a and 6b were grown and formed over the side surfaces of the second step sections 4a and 4b and the substrate surface of the substrate 1 as growth base planes. At the time, the diamond insulation regions 6a and 6b were doped with substantially no phosphorus, and could be regarded as insulation regions. Further, no diamond crystal grew over regions of the substrate 1 (crystal face {001}) that were not in the proximity of the side surfaces of the diamond step section 2'. Hence, the phosphorus-doped diamond regions 5a and 5n and the diamond insulation regions 6a and 6b could be selectively grown.

The phosphorus concentration in the selectively grown phosphorus-doped diamond regions 5a and 5b was about $8 \times 10^{19}$ cm$^{-3}$ when measured by SIMS (Secondary Ion Mass Spectroscopy).

Figure 4:
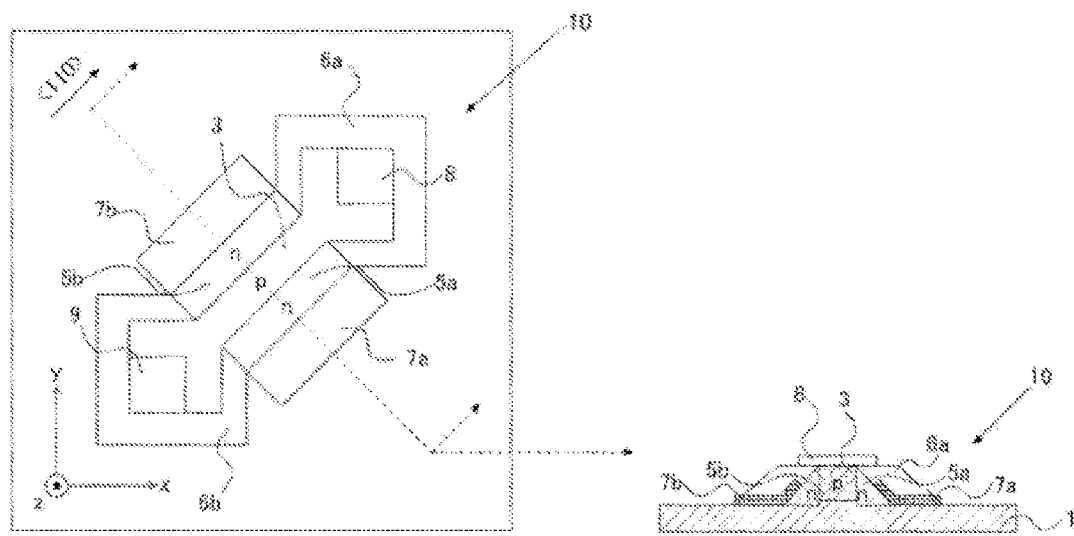
FIG. 4 is a diagram (4) showing a manufacturing process of a diamond semiconductor device according to a first embodiment.
Figure 5A:
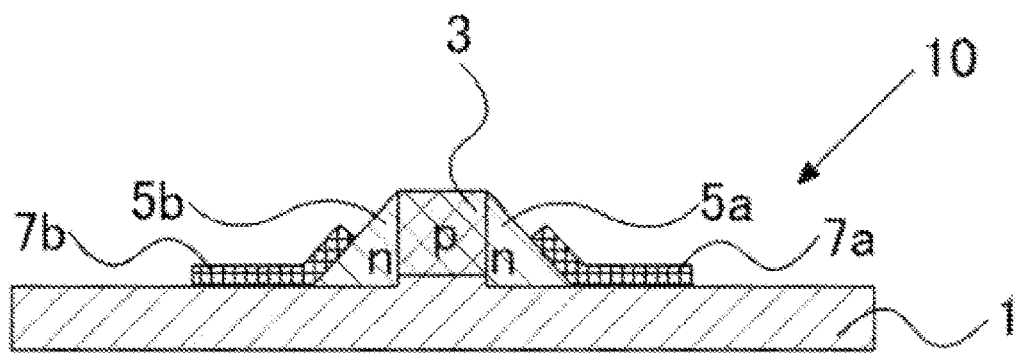
FIG. 5A is a diagram (1) showing an expanse of a depletion layer that changes according to gate voltage application conditions.
Figure 5B:
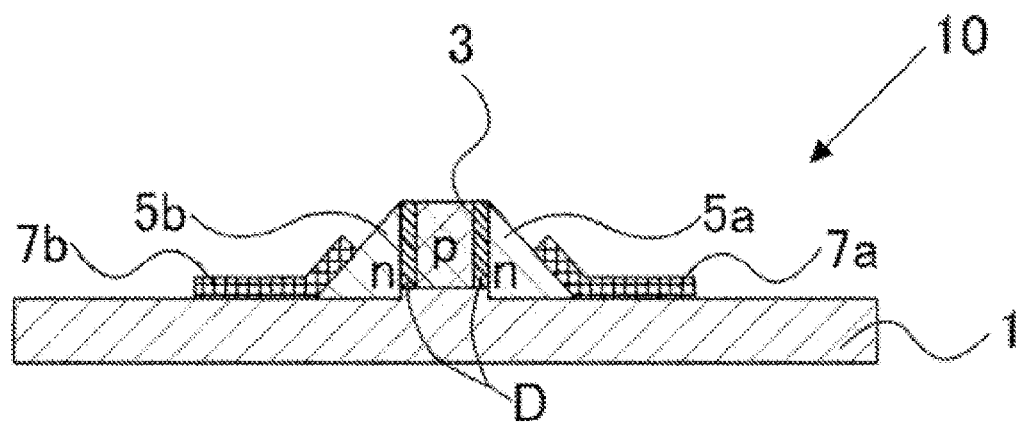
FIG. 5B is a diagram (2) showing an expanse of a depletion layer that changes according to gate voltage application conditions.
Figure 5C:
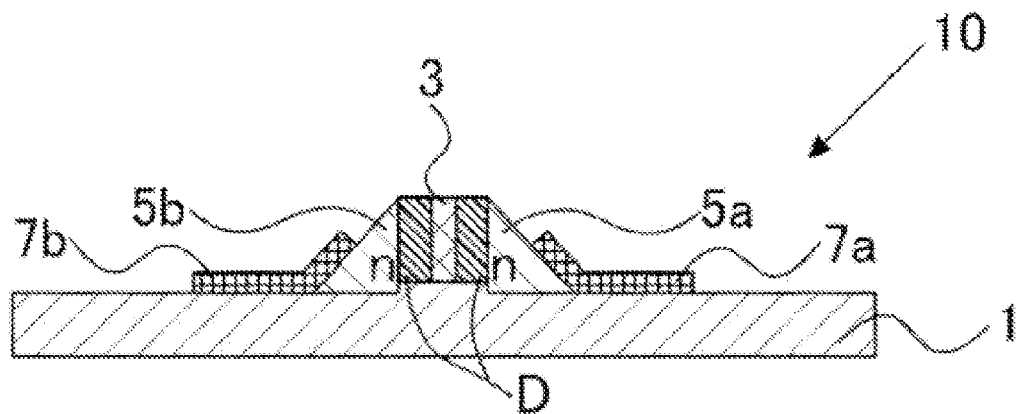
FIG. 5C is a diagram (3) showing an expanse of a depletion layer that changes according to gate voltage application conditions.
Figure 5D:
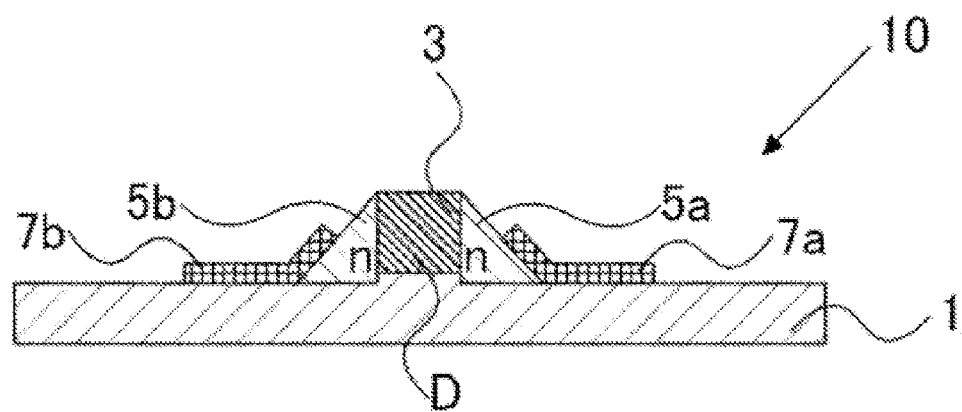
FIG. 5D is a diagram (4) showing an expanse of a depletion layer that changes according to gate voltage application conditions.
Figure 6:
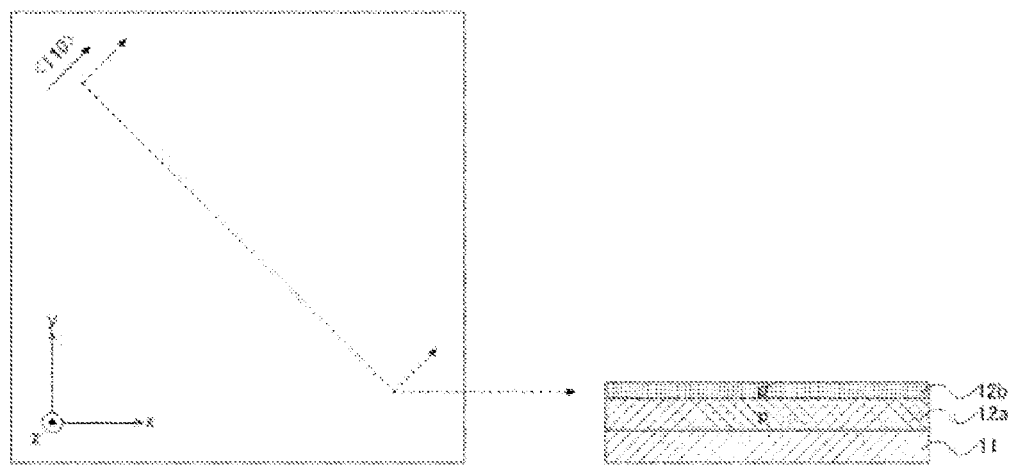
FIG. 6 is a diagram (1) showing a manufacturing process of a diamond semiconductor device according to a second embodiment.
Figure 12:
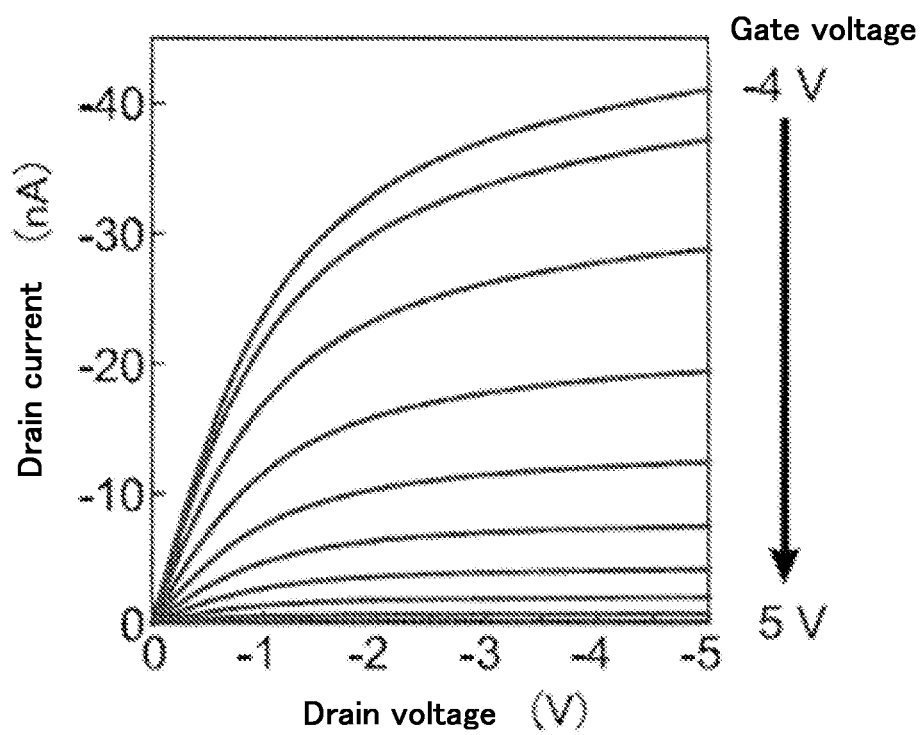
FIG. 12 is a diagram showing drain current-drain voltage characteristics at various gate voltages.
Figure 13:
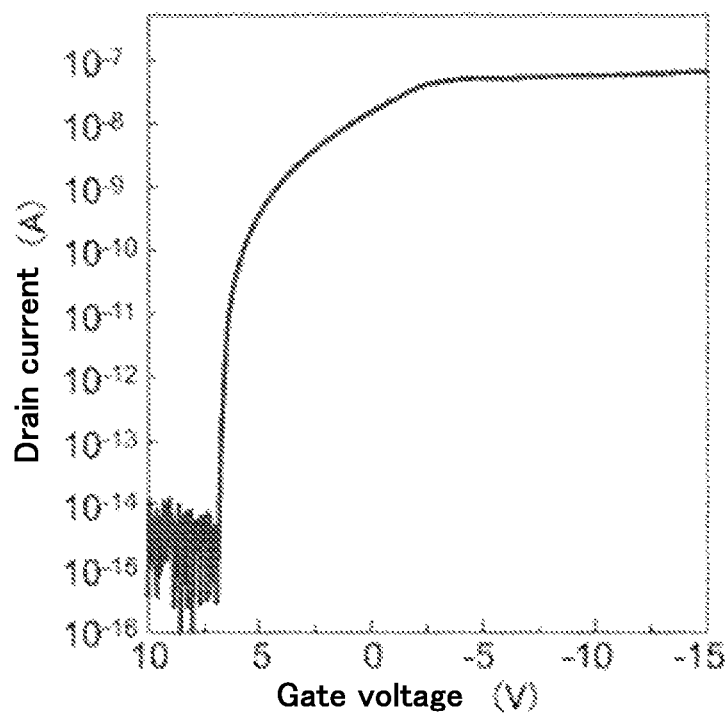
FIG. 13 is a diagram showing a drain current-gate voltage characteristic at a drain voltage of −10 V.

Next, as shown in FIG. 4, Ti (30 nm), Pt (30 nm), and Au (100 nm) were vapor-deposited as gate electrodes 7a and 7b, a source electrode 8, and a drain electrode 9, respectively, to thereby manufacture a junction-type field effect transistor according to Example. In order to measure the electric conductivity of this junction-type field effect transistor, characteristics thereof was evaluated by changing the gate voltage from −15 V to 10 V, and a source-drain voltage from 0 V to −10 V. FIG. 12 shows drain current-drain voltage characteristics at various gate voltages. FIG. 13 shows a drain current-gate voltage characteristic at a drain voltage of −10 V. As shown in FIG. 12 and FIG. 13, obvious transistor characteristics were achieved with the junction-type field effect transistor according to Example, a leakage current thereof was about $10^{-15}$ A, and an ON/OFF ratio thereof was about 7 digits.

REFERENCE SIGNS LIST 1, 11, 21, 21', 31, 31' diamond substrate
2, 12a p-type diamond layer
2', 12a', 22', 32' diamond step section
3, 13, 23 first step section
4a, 4b, 14a, 14b, 24 second step section
5a, 5b, 15a, 15b, 25, 35 phosphorus-doped diamond region
6a, 6b, 16a, 16b, 26 diamond insulation region
7a, 7b, 17a, 17b, 27, 37b gate electrode
8, 18, 28, 38 source electrode
9, 19, 29, 39 drain electrode
10, 20, 30, 40 diamond semiconductor device
12b p$^+$ diamond layer
12b', 12b'' p$^+$ contact region
22, 32 p-type semiconductor layer
37a gate insulation film
41 p$^+$ region
W line width
H height
D depletion layer
S interval

The invention claimed is:
1. A diamond semiconductor device, comprising:
 a diamond substrate;
 a diamond step section disposed over a substrate surface of the diamond substrate having a {001} crystal face in a manner to rise from the substrate surface substantially perpendicularly to the substrate surface, the diamond step section forming a step shape with risen top and side surfaces thereof, and with the substrate surface;
 an n-type phosphorus-doped diamond region; and
 a diamond insulation region,
 wherein in the diamond step section, a first step section having a {110} crystal face over a side surface thereof, and a second step section having a {100} crystal face over a side surface thereof are integrated with each other,
 wherein the phosphorus-doped diamond region is formed by crystal growth started from a base angle of the step shape of the first step section over the side surface of the first step section and the substrate surface of the diamond substrate as growth base planes,
 wherein the diamond insulation region is formed by crystal growth over the side surface of the second step section and the substrate surface of the diamond substrate as growth base planes, and wherein there is selective integral formation of the doped diamond region at an intended location and the diamond insulation region.

2. The diamond semiconductor device according to claim 1, wherein the first step section has an elongate line shape when seen in a plan view, and the second step section is integrated with at least any end position of the first step section assumed as a trunk section.

3. The diamond semiconductor device according to claim 2, wherein the diamond semiconductor device comprises the phosphorus-doped diamond region over both side surfaces of the first step section having the line shape.

4. The diamond semiconductor device according to claim 2, wherein the second step section has the {100} crystal face over at least part of side surfaces thereof that are located on left and right sides with respect to a line direction of the first step section when the second step section is seen in a plan view.

5. The diamond semiconductor device according to claim 2, wherein a line width W of the first step section having the line shape is from 100 nm to 10 μm.

6. The diamond semiconductor device according to claim 2, wherein a ratio H/W of a height H to a line width W of the first step section having the line shape is from 0.001 to 100.

7. The diamond semiconductor device according to claim 1, wherein the diamond semiconductor device comprises a p-type impurity-doped region in the diamond step section.

8. The diamond semiconductor device according to claim 1, wherein a phosphorus concentration in the phosphorus-doped diamond region is from $1 \times 10^{16}$ cm$^{-3}$ to $1 \times 10^{21}$ cm$^{-3}$.

9. The diamond semiconductor device according to claim 2, wherein the diamond semiconductor device comprises a plurality of the diamond step section in each of which the first step section has an elongate line shape when seen in a plan view, and the second step section is integrated with at least any end position of the first step section assumed as a trunk section, and wherein the diamond step sections are disposed side by side at left and right positions with respect to a line direction of the first step sections.

10. The diamond semiconductor device according to claim 9, wherein an interval between the first step sections of the diamond step sections disposed side by side is from 0.01 to 2 times as large as a height H of the first step sections.

11. The diamond semiconductor device according to claim 7, wherein the diamond semiconductor device comprises: a gate electrode at the phosphorus-doped diamond region formed over each of both side surfaces of the first step section; a source electrode at one of two second step sections that are formed at both end positions respectively of the first step section assumed as a trunk section; and a drain electrode at the other second step section.

12. A diamond semiconductor device manufacturing method for manufacturing a diamond semiconductor device comprising:

a diamond substrate;

a diamond step section disposed over a substrate surface of the diamond substrate having a {001} crystal face in a manner to rise from the substrate surface substantially perpendicularly to the substrate surface, the diamond step section forming a step shape with risen top and side surfaces thereof, and with the substrate surface;

an n-type phosphorus-doped diamond region; and a diamond insulation region, wherein in the diamond step section, a first step section having a {110} crystal face over a side surface thereof, and a second step section having a {100} crystal face over a side surface thereof are integrated with each other, wherein the phosphorus-doped diamond region is formed by crystal growth started from a base angle of the step shape of the first step section over the side surface of the first step section and the substrate surface of the diamond substrate as growth base planes, and wherein the diamond insulation region is formed by crystal growth over the side surface of the second step section and the substrate surface of the diamond substrate as growth base planes, the method comprising:

applying lithography to the diamond substrate using a mask in a manner to form the first step section and the second step section, to thereby form the diamond step section; and forming the phosphorus-doped diamond region by crystal growth started from the base angle of the step shape of the first step section over the side surface of the first step section and the substrate surface of the diamond substrate as growth base planes, and at a same time, forming the diamond insulation region by crystal growth over the side surface of the second step section and the substrate surface of the diamond substrate as growth base planes, by CVD using a diamond source and a phosphorus source as material gases wherein there is selective integral formation of the doped diamond region at an intended location and the diamond insulation region.

13. The diamond semiconductor device according to claim 2, wherein the diamond semiconductor device comprises a p-type impurity-doped region in the diamond step section.

14. The diamond semiconductor device according to claim 2, wherein a phosphorus concentration in the phosphorus-doped diamond region is from $1 \times 10^{16}$ cm$^{-3}$ to $1 \times 10^{21}$ cm$^{-3}$.

15. The diamond semiconductor device according to claim 13, wherein the diamond semiconductor device comprises: a gate electrode at the phosphorus-doped diamond region formed over each of both side surfaces of the first step section; a source electrode at one of two second step sections that are formed at both end positions respectively of the first step section assumed as a trunk section; and a drain electrode at the other second step section.

* * * * *